US011765895B2

(12) United States Patent
Eom

(10) Patent No.: US 11,765,895 B2
(45) Date of Patent: Sep. 19, 2023

(54) SEMICONDUCTOR DEVICE AND METHOD FOR FABRICATING THE SAME

(71) Applicant: SK hynix Inc., Icheon-si (KR)

(72) Inventor: Dae Sung Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/876,006

(22) Filed: Jul. 28, 2022

(65) Prior Publication Data

US 2022/0367502 A1 Nov. 17, 2022

Related U.S. Application Data

(63) Continuation of application No. 16/919,835, filed on Jul. 2, 2020, now Pat. No. 11,404,428.

(30) Foreign Application Priority Data

Feb. 10, 2020 (KR) .................... 10-2020-0015884

(51) Int. Cl.
| | | |
|---|---|---|
| *H01L 29/06* | (2006.01) | |
| *H01L 21/76* | (2006.01) | |
| *H10B 43/10* | (2023.01) | |
| *H01L 21/762* | (2006.01) | |
| *H10B 41/10* | (2023.01) | |
| *H10B 41/27* | (2023.01) | |
| *H10B 43/27* | (2023.01) | |

(52) U.S. Cl.
CPC ....... *H10B 43/10* (2023.02); *H01L 21/76224* (2013.01); *H01L 29/0649* (2013.01); *H10B 41/10* (2023.02); *H10B 41/27* (2023.02); *H10B 43/27* (2023.02)

(58) Field of Classification Search
CPC .......... H01L 21/76224; H01L 29/0649; H10B 41/10; H10B 41/27; H01B 43/10; H01B 43/27
USPC ......................................................... 257/314
See application file for complete search history.

(56) References Cited

U.S. PATENT DOCUMENTS

| | | | |
|---|---|---|---|
| 9,698,156 B2 | 7/2017 | Lue | |
| 2012/0208347 A1* | 8/2012 | Hwang | ................. H01L 21/762 257/E21.546 |

(Continued)

FOREIGN PATENT DOCUMENTS

| | | |
|---|---|---|
| KR | 1020190106258 A | 9/2019 |
| KR | 1020210043241 A | 4/2021 |

*Primary Examiner* — Monica D Harrison
(74) *Attorney, Agent, or Firm* — WILLIAM PARK & ASSOCIATES LTD.

(57) ABSTRACT

A semiconductor device includes: a stacked structure comprising a plurality of dielectric layers and a plurality of conductive layers, wherein the dielectric layers are alternately stacked with the conductive layers; a groove formed for each conductive layer by recessing the conductive layer to the inside of the stacked structure; and an isolation structure formed through the stacked structure so as to isolate the stacked structure into a first block and a second block. The isolation structure comprises a first isolation structure and a second isolation structure adjacent to the first isolation structure with a gap provided between the first and second isolation structures, and one end of the first isolation structure and the other end of the second isolation structure, which face each other, have a vortex shape when viewed from above.

11 Claims, 17 Drawing Sheets

(56) References Cited

U.S. PATENT DOCUMENTS

2017/0076977 A1    3/2017   Ha et al.
2018/0033799 A1    2/2018   Kanamori et al.

\* cited by examiner

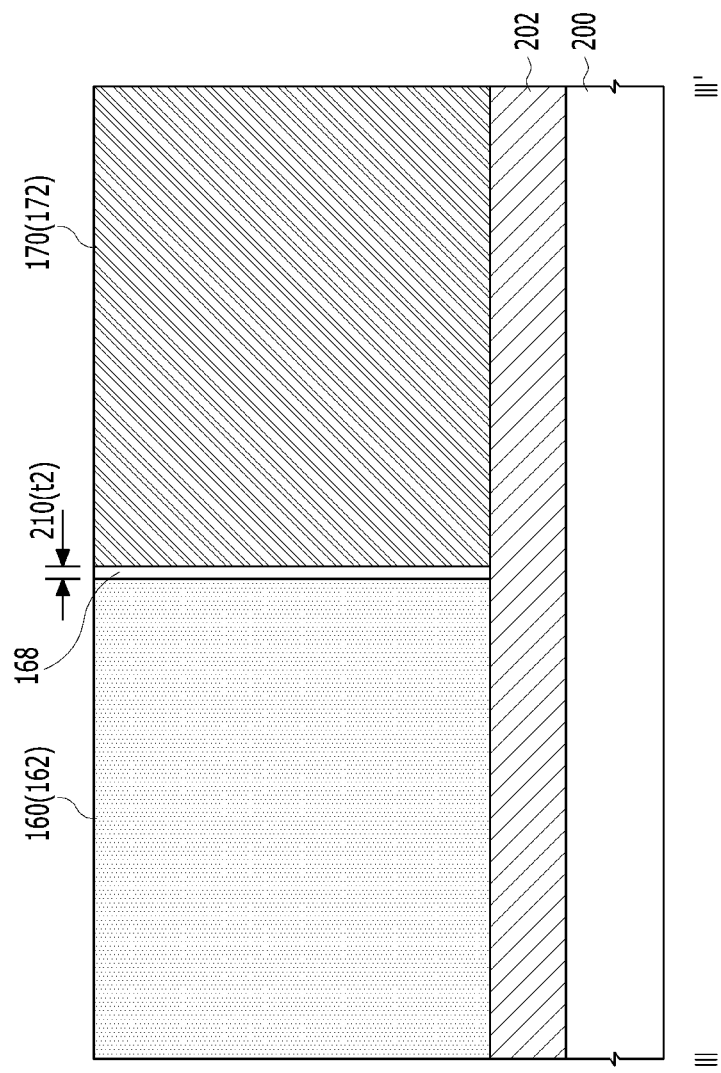

SEMICONDUCTOR DEVICE AND METHOD FOR FABRICATING THE SAME

CROSS-REFERENCE TO RELATED APPLICATIONS

The present application is a continuation application of U.S. patent application Ser. No. 16/919,835, filed on Jul. 2, 2020, which claims priority under 35 U.S.C. § 119(a) to Korean Patent Application No. 10-2020-0015884 filed on Feb. 10, 2020, in the Korean Intellectual Property Office, the entire disclosure of which is incorporated herein by reference.

BACKGROUND

1. Technical Field

Various embodiments generally relate to an electronic device, and more particularly, to a semiconductor device and a method for fabricating the same.

2. Related Art

A nonvolatile memory device is a memory device capable of retaining data stored therein even when a supply of power is interrupted. Recently, as the improvement in integration density of 2D nonvolatile memory devices in which memory cells are formed as a single layer on a substrate reaches its limit, 3D nonvolatile memory devices have been suggested, in which memory cells are vertically stacked on a substrate. 3D nonvolatile memory devices include channel layers formed through stacked structures in which interlayer dielectric layers and gate electrodes are alternately stacked, and memory cells are stacked along the channel layers. In order to improve the operation reliability of nonvolatile memory devices having a 3D structure, various structures and fabrication methods are developed.

SUMMARY

Various embodiments are directed to a semiconductor device which can facilitate a fabrication process and has a stable structure and enhanced characteristics.

In an embodiment, a semiconductor device may include: a stacked structure comprising a plurality of dielectric layers and a plurality of conductive layers, wherein the dielectric layers are alternately stacked with the conductive layers; a groove formed for each conductive layer by recessing the conductive layer to the inside of the stacked structure; and an isolation structure formed through the stacked structure so as to isolate the stacked structure into a first block and a second block. The isolation structure comprises a first isolation structure and a second isolation structure adjacent to the first isolation structure with a gap provided between the first and second isolation structures, and one end of the first isolation structure and the other end of the second isolation structure, which face each other, have a vortex shape when viewed from above.

In an embodiment, a semiconductor device may include: a stacked structure formed on a substrate and comprising a plurality of interlayer dielectric layers and a plurality of gate conductive layers, wherein the interlayer dielectric layers are alternately stacked with the gate conductive layers; a groove formed for each gate conductive layer by recessing the gate conductive layer to the inside of the stacked structure; and an isolation structure comprising a first isolation structure formed through the stacked structure so as to isolate the stacked structure into a first block and a second block, and a second isolation structure adjacent to the first isolation structure with a gap provided between the first and second isolation structures. The first isolation structure comprises a first slit pattern extended in one direction and a first vortex pattern extended from one end of the first slit pattern and having a vortex shape when viewed from above. The second isolation structure comprises a second slit pattern extended in one direction and disposed adjacent to the first slit pattern with the gap provided between the first and second slit patterns, and a second vortex pattern extended from the other end of the second slit pattern and having a vortex shape when viewed from above.

In an embodiment, a method for fabricating a semiconductor device may include the steps of: forming a stacked body over a substrate, the stacked body including a plurality of dielectric layers and a plurality of sacrificial layers alternately stacked with the dielectric layers; forming a second isolation structure through the stacked body; forming an opening through the stacked body, the opening being adjacent to the second isolation structure with a gap provided therebetween; removing the sacrificial layers of the stacked body through the opening; forming a conductive layer to gap-fill the spaces from which the sacrificial layers are removed; forming a groove by recessing the conductive layer to the inside of the stacked body; and forming a first isolation structure to gap-fill the opening. One end of the first isolation structure and the other end of the second isolation structure, facing each other, have a vortex shape when viewed from above.

The method may further include forming a spacer on a sidewall of the opening such that a part of the spacer gap-fills the groove, before forming the first isolation structure to gap-fill the opening.

The gap may have a smaller critical dimension than the groove. The one end of the first isolation structure and the other end of the second isolation structure, facing each other, may have a vortex shape when viewed from above, and may be formed in such a shape that two patterns are engaged and rotated. The first isolation structure may include a first slit pattern extended in one direction and a first vortex pattern extended from one end of the first slit pattern and having a vortex shape when viewed from above. The second isolation structure may include a second slit pattern extended in one direction and disposed adjacent to the first slit pattern with the gap provided therebetween, and a second vortex pattern extended from the other end of the second slit pattern and having a vortex shape when viewed from above. The first and second vortex patterns may be located on one side or the other side of the first slit pattern, or located on either side of the first slit pattern so as to be symmetrical with respect to the first slit pattern. The second vortex pattern may be located outside of the first vortex pattern and has a shape to surround the first vortex pattern, and the first vortex pattern has a smaller length than the second vortex pattern.

In accordance with the present embodiments, the semiconductor device and the method for fabricating the same may isolate the stacked structure into the first and second blocks using the first isolation structure and the second isolation structure, which do not overlap each other, thereby preventing damage to the structure located under the stacked structure during the isolation structure forming process.

Furthermore, one end of the first isolation structure and the other end of the second isolation structure, facing each other, have a vortex shape when seen from the top, and are formed in such a shape that the two patterns are engaged and rotated. Thus, although misalign occurs between processes, it is possible to prevent an abnormal conductive path from being formed between the gate conductive layer located in the first block and the gate conductive layer located in the second block.

Furthermore, as the second vortex pattern of the second isolation structure serves as an align key during the first isolation structure forming process, it is possible to improve the process accuracy during the first isolation structure forming process.

BRIEF DESCRIPTION OF THE DRAWINGS

FIGS. 5A to 5C are cross-sectional views illustrating the semiconductor device in accordance with the present embodiment, taken along the I-I' line, II-II' line, and III-III' line of FIG. 4.

DETAILED DESCRIPTION

The following embodiments provide a semiconductor device which can facilitate a fabrication method and has a stable structure with enhanced characteristics, and a method for fabricating the same. More specifically, the embodiments relate to an isolation structure for isolating memory blocks in a 3D semiconductor memory device based on a stacked structure in which a plurality of interlayer dielectric layers and a plurality of gate conductive layers are alternately stacked. The isolation structure may include a first isolation structure and a second isolation structure adjacent to the first isolation structure with a gap provided therebetween, and one end of the first isolation structure and the other end of the second isolation structure, which face each other, may have a vortex shape when viewed from the top.

Hereafter, a semiconductor device and a method for fabricating the same in accordance with an embodiment will be described in detail with reference to the drawings.

Figure 1A:
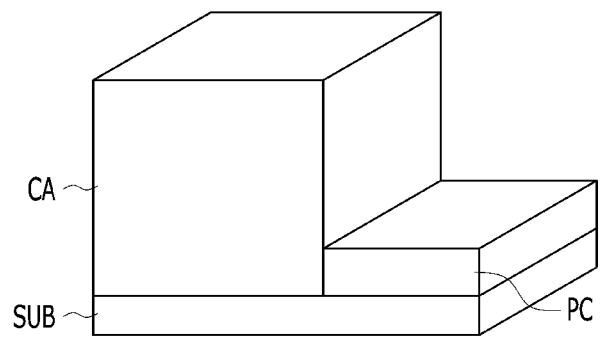
FIGS. 1A and 1B are block diagrams schematically illustrating a semiconductor device in accordance with an embodiment.
Figure 1B:
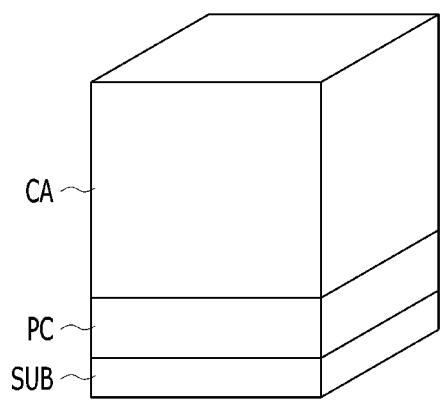

FIGS. 1A and 1B are block diagrams schematically illustrating a semiconductor device in accordance with an embodiment.

As illustrated in FIGS. 1A and 1B, the semiconductor device may include a peripheral circuit PC and a cell array CA which are arranged on a substrate SUB.

The substrate SUB may be a single crystal semiconductor layer. For example, the substrate SUB may be any one of a bulk silicon substrate, a silicon-on-insulator substrate, a germanium substrate, a germanium-on-insulator substrate, a silicon-germanium substrate, and an epitaxial thin film formed through a selective epitaxial growth method.

The cell array CA may include a plurality of memory blocks. Each of the memory blocks may include a plurality of cell strings. Each of the cell strings may be electrically coupled to a bit line, a source line, word lines, and select lines. Each of the cell strings may include memory cells and select transistors which are coupled in series. Each of the select lines may be used as a gate electrode of the corresponding select transistor, and each of the word lines may be used as a gate electrode of the corresponding memory cell.

The peripheral circuit PC may include N-type metal-oxide-semiconductor (NMOS) and P-type metal-oxide-semiconductor (PMOS) transistors, a register, and a capacitor, which are electrically coupled to the cell array CA. The NMOS and PMOS transistors, the register, and the capacitor may be used as elements which constitute a row decoder, a column decoder, a page buffer, and a control circuit.

As illustrated in FIG. 1A, the semiconductor device in accordance with the present embodiment may have a structure in which the cell array CA and the peripheral circuit PC are arranged adjacent to each other on the substrate SUB.

As illustrated in FIG. 1B, the semiconductor device in accordance with the present embodiment may also have a structure in which the peripheral circuit PC and the cell array CA are sequentially stacked over the substrate SUB. In this case, because the peripheral circuit PC overlaps the cell array CA, the area of the substrate SUB, occupied by the cell array CA and the peripheral circuit PC, can be reduced.

Figure 2:
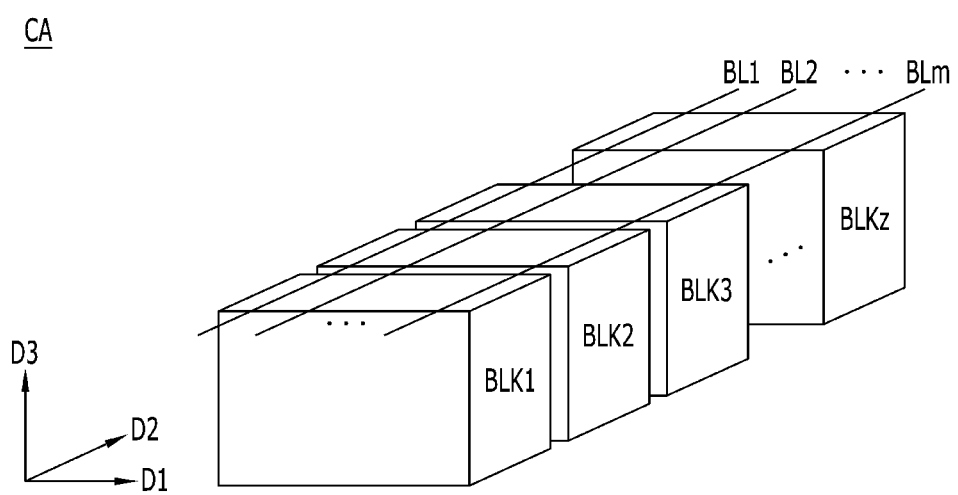
FIG. 2 is a diagram illustrating memory blocks of the semiconductor device in accordance with the present embodiment.

FIG. 2 is a diagram illustrating memory blocks of the semiconductor device in accordance with the present embodiment.

As illustrated in FIG. 2, the cell array CA of the semiconductor device in accordance with the present embodiment may include a plurality of memory blocks BLK1 to BLKz. For example, the plurality of memory blocks BLK1 to BLKz may be arranged in a second direction D2 in which bit lines BL1 to BLm are extended, and spaced apart from each other. For example, the first to $z^{th}$ memory blocks BLK1 to BLKz may be arranged in the second direction D2 so as to be spaced apart from each other, and include a plurality of memory cells stacked in a third direction D. At this time, the first to $z^{th}$ memory blocks BLK1 to BLKz may be spaced apart from each other by an isolation structure (see FIG. 4) which will be described below.

The first direction D1 may correspond to an x-axis direction or side-to-side direction, the second direction D2 may correspond to a y-axis direction or front-to-rear direction perpendicular to the first direction D1, and the third direction D3 may correspond to a z-axis direction or vertical direction perpendicular to the first and second directions D1 and D2.

Figure 3:
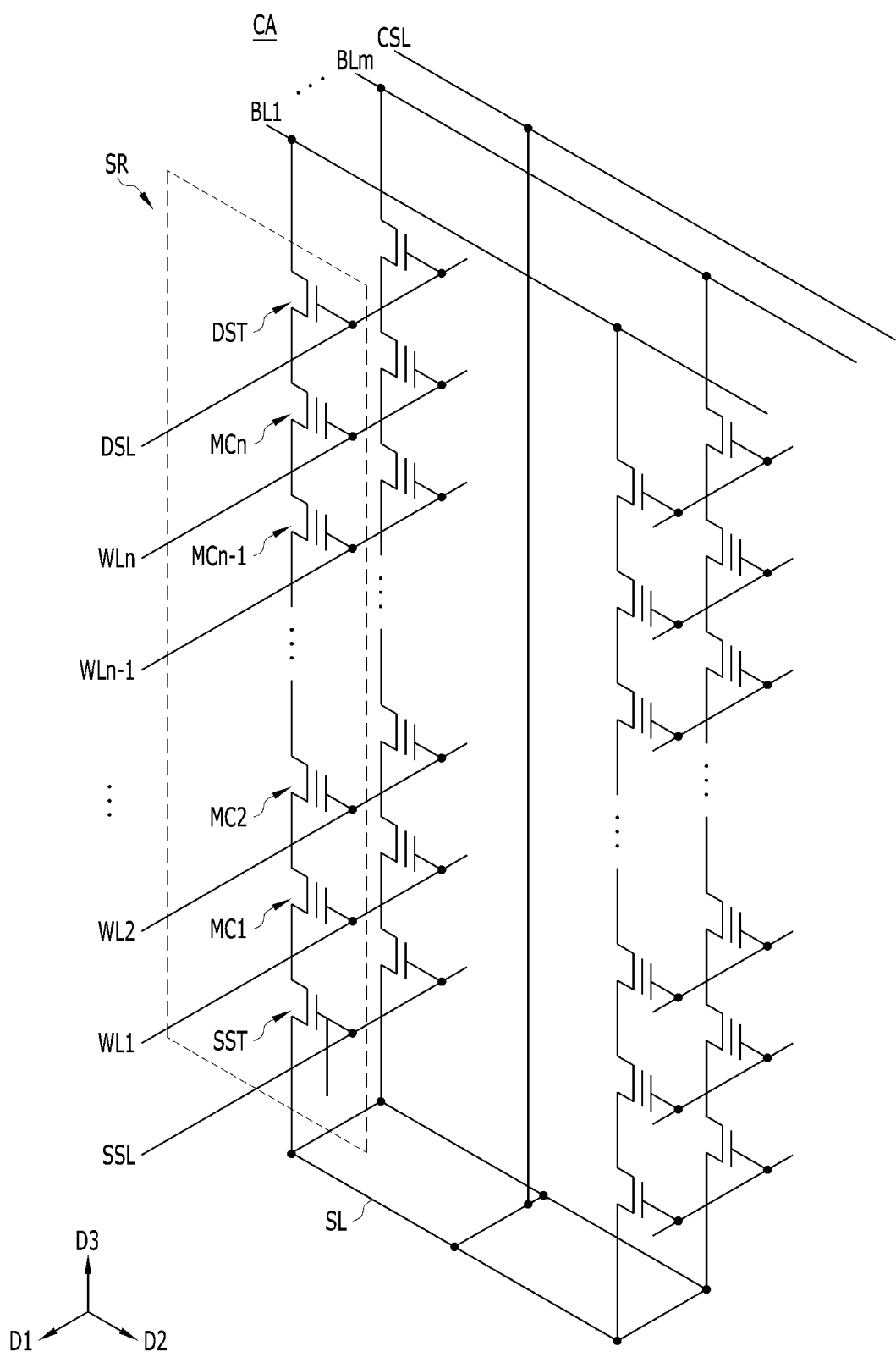
FIG. 3 is an equivalent circuit diagram illustrating a memory block of the semiconductor device in accordance with the present embodiment.

FIG. 3 is an equivalent circuit diagram illustrating a memory block of the semiconductor device in accordance with the present embodiment.

As illustrated in FIG. 3, the cell array of the semiconductor device in accordance with the present embodiment may include a plurality of memory blocks, and each of the memory blocks may include a plurality of cell strings SR. Each of the cell strings SR may include a source select transistor SST, a plurality of memory cell transistors MC1 to MCn, and a drain select transistor DST, which are coupled in series. For reference, FIG. 3 illustrates the case in which one cell string SR includes one source select transistor SST and one drain select transistor DST, but each of the source select transistor SST and the drain select transistor DST may represent a plurality of select transistors coupled in series. At this time, the number of source select transistors coupled in series may be equal to or greater than the number of drain select transistors coupled in series.

The cell strings SR may be arranged in a matrix shape in the first and second directions D1 and D2 and thus constitute an array. The cell strings SR located on the same line in the second direction D2 may be coupled to the same bit line. The cell strings SR located on the same line in the first direction D1 may be coupled to gate lines SSL, WL1 to WLn, and DSL in common.

The source select transistor SST, the plurality of memory cell transistors MC1 to MCn and the drain select transistor DST, which constitute one cell string SR, may share one channel layer. The cell strings SR may be disposed between the bit lines BL1 to BLm and a source line SL. The gate lines SSL, WL1 to WLn, and DSL may be stacked between the bit lines BL1 to BLm and the source line SL, and the gate lines SSL, WL1 to WLn, and DSL may be electrically insulated from each other.

The source select line SSL may be used as a gate electrode of the source select transistor SST, and the word lines WL1 to WLn may be used as gate electrodes of the memory cell transistors MC1 to MCn. The drain select line DSL may be used as a gate electrode of the drain select transistor DST. The word lines WL1 to WLn may be stacked and arranged in parallel. The source select line SSL may be disposed under the word lines WL1 to WLn, and the drain select line DSL may be disposed over the word lines WL1 to WLn.

The bit lines BL1 to BLm may be coupled to the respective drain select transistors DST of the corresponding cell strings SR arranged in the second direction D2. For example, the cell strings SR coupled to one drain select line DSL in common may be coupled to different bit lines BL1 to BLm, respectively. Therefore, when one drain select line DSL is selected and one of the bit lines BL1 to BLm is selected, any one of the plurality of cell strings SR may be selected.

The source line SL may be electrically coupled to the common source line CSL. The source line SL may transmit an operation voltage applied to the common source line CSL to the cell strings SR. The operation voltage may be selectively transferred to the cell string SR according to the voltage level of the source select line SSL.

Figure 4:
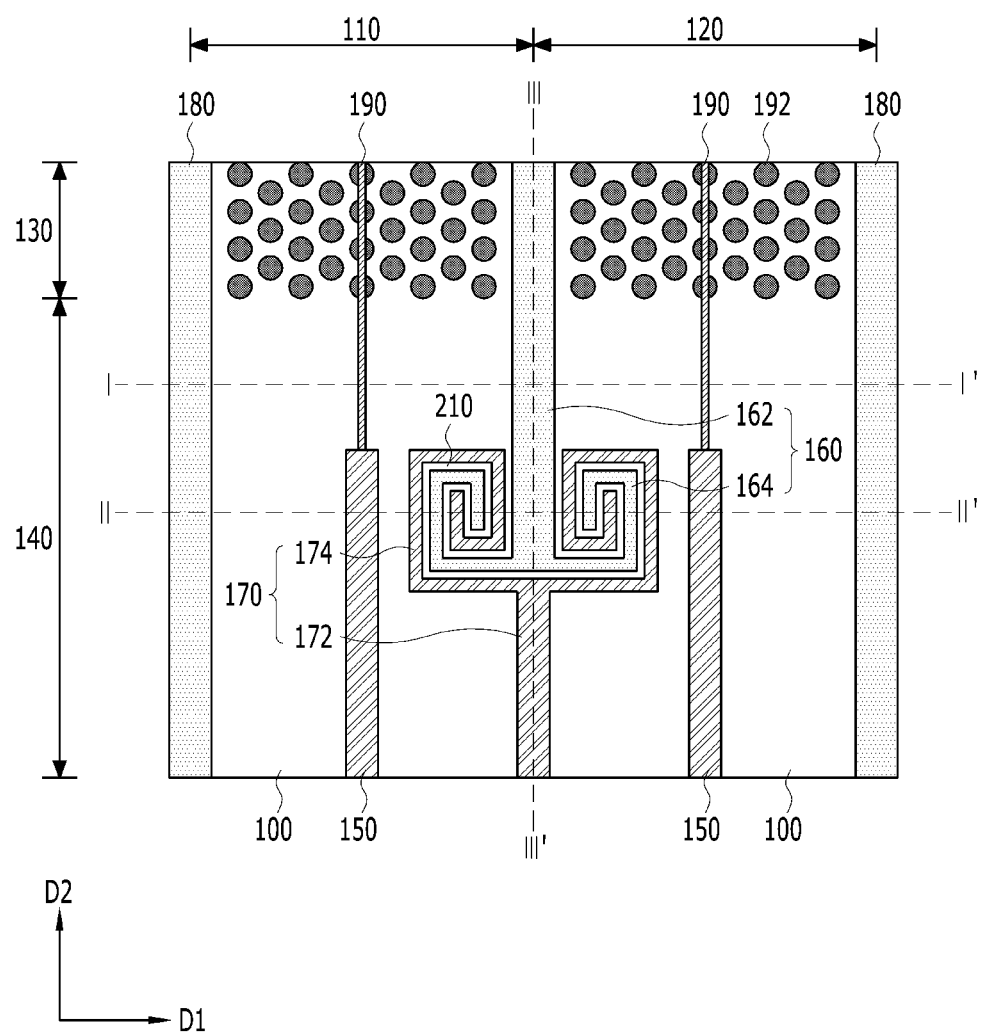
FIG. 4 is a plan view illustrating the semiconductor device in accordance with the present embodiment.
Figure 5A:
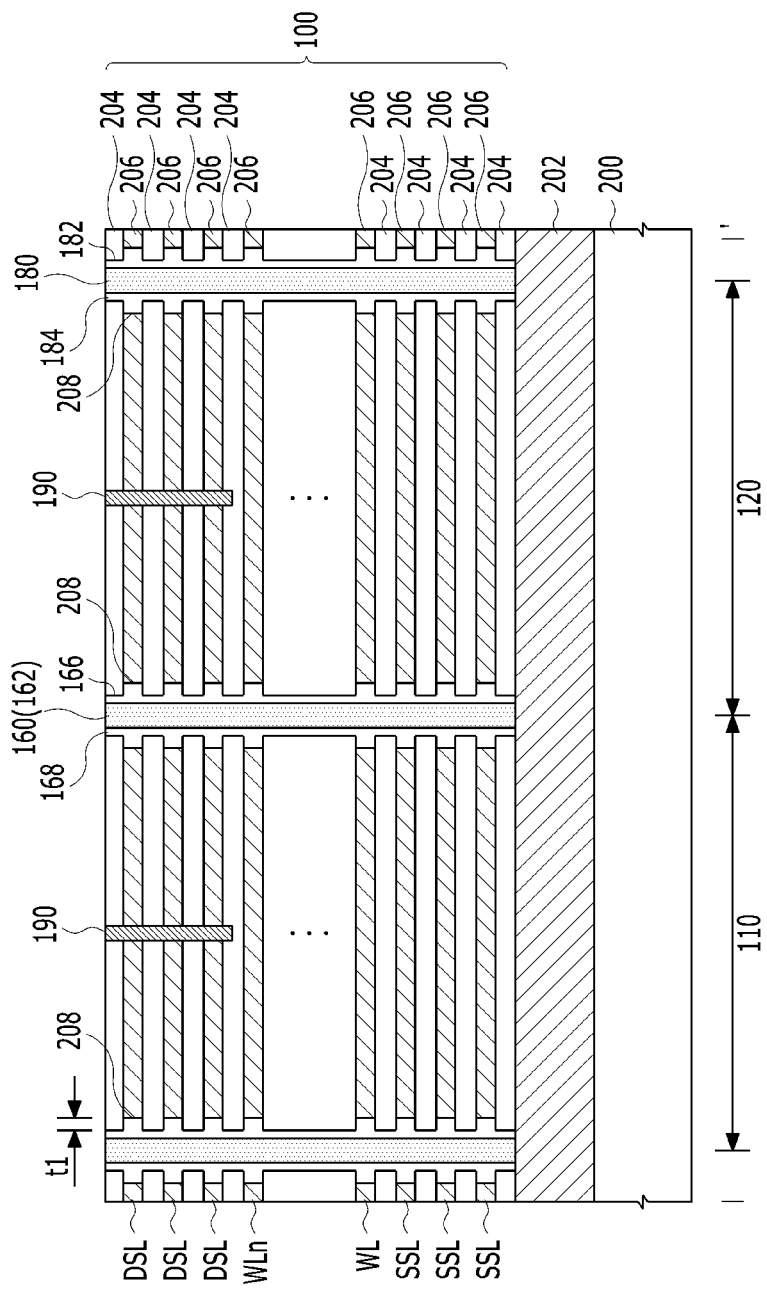
Figure 5B:
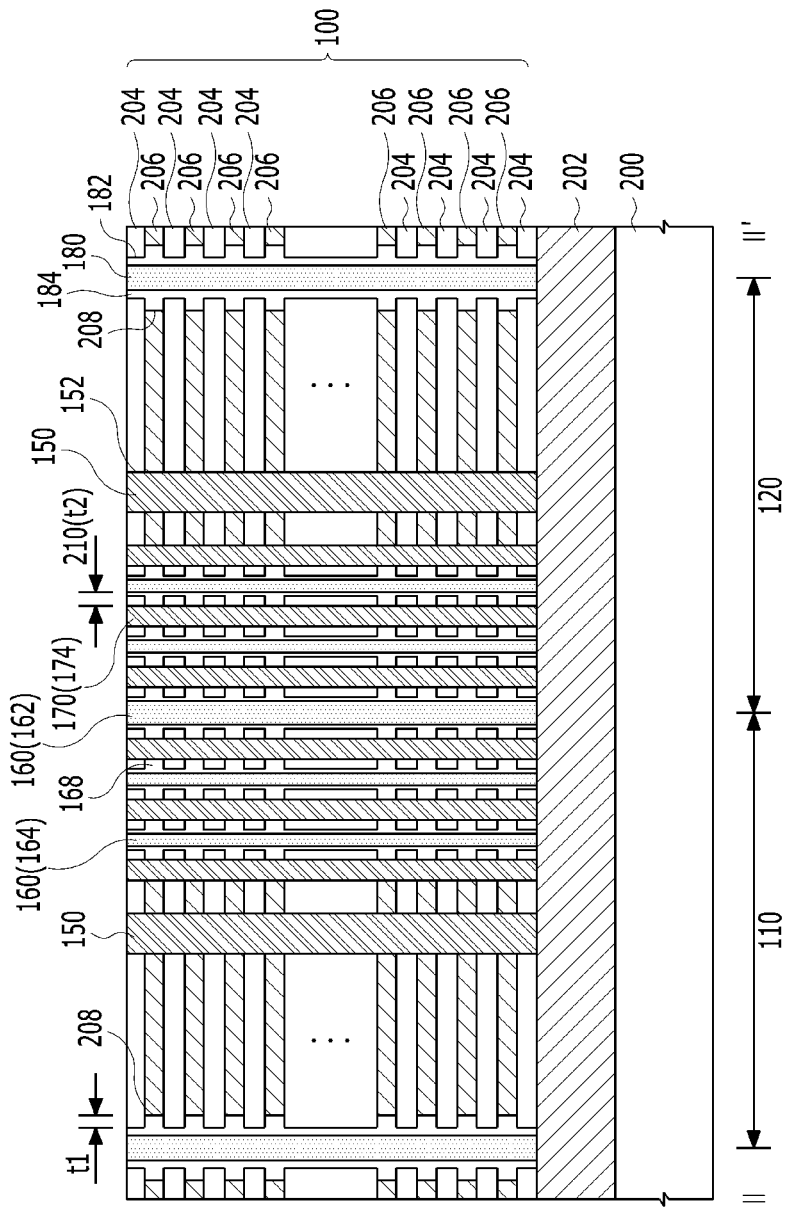

FIG. 4 is a plan view illustrating the semiconductor device in accordance with the present embodiment. FIGS. 5A to 5C are cross-sectional views illustrating the semiconductor device in accordance with the present embodiment, taken along the I-I' line, II-II' line, and III-III' line of FIG. 4.

As illustrated in FIG. 4, the semiconductor device may include a stacked structure 100 having a cell area 130 and a contact area 140 and an isolation structure formed in the stacked structure 100 so as to isolate the stacked structure 100 into first and second blocks 110 and 120. Each of the first and second blocks 110 and 120 may be a memory block (see FIG. 2). The isolation structure may include first and second isolation structures 160 and 170 which are extended in the second direction D2 and arranged adjacent to each other with a gap 210 provided therebetween. One end of the first isolation structure 160 and the other end of the second isolation structure 170, which face each other, may have a vortex shape when viewed from the top.

The first isolation structure 160 may isolate the first and second blocks 110 and 120 from each other, and simultaneously serve as the common source line CSL (see FIG. 3). The first isolation structure 160 may include a line-type first slit pattern 162 and a first vortex pattern 164. The first slit pattern 162 may be extended from the cell area 130 to the contact area 140 in the second direction D2, and the first vortex pattern 164 may be extended from one end of the first slit pattern 162 and have a vortex shape when viewed from the top. In the first direction D1, the first vortex patterns 164 may be located on both sides of the first slit pattern 162, and have a symmetrical shape with respect to the first slit pattern 162. The first vortex pattern 164 may have a smaller critical dimension than the first slit pattern 162.

In the present embodiment, it is exemplified that the first vortex patterns 164 are formed on both sides of the one end of the first slit pattern 162 in the first direction D1. However, the first vortex pattern 164 may be formed only on one side or the other side of the first slit pattern 162.

The second isolation structure 170 may serve to isolate the first and second blocks 110 and 120 from each other with the first isolation structure 160, and simultaneously support the stacked structure 100 between processes. The second isolation structure 170 may be formed in the contact area 140, and include a line-type second slit pattern 172 and a second vortex pattern 174. The second slit pattern 172 may be extended in the second direction D2, and the second vortex pattern 174 may be extended from the other end of the second slit pattern 172 in the second direction D2 and have a vortex shape when viewed from the top. In the first direction D1, the second vortex patterns 174 may be located on both sides of the first slit pattern 162, and have a symmetrical shape with respect to the first slit pattern 162. The reason why the second vortex patterns 174 are located on both sides of the first slit pattern 162 is in order to prevent a process fail from occurring during a process of forming the first isolation structure 160, and to effectively prevent an abnormal conductive path from being formed between a gate conductive layer 206 located in the first block 110 and a gate conductive layer 206 located in the second block 120. The second vortex pattern 174 may be disposed adjacent to the first vortex pattern 164 with the gap 210 provided therebetween, and the first vortex pattern 164 and the second vortex pattern 174 may be formed in such a shape that the two patterns are engaged and rotated, as illustrated in FIG. 4. The second vortex pattern 174 may have a smaller critical dimension than the second slit pattern 172, and have the same critical dimension as the first vortex pattern 164. The second vortex pattern 174 may be located outside the first vortex pattern 164 so as to surround the first vortex pattern 164, and have a longer length than the first vortex pattern 164.

The gap 210 between the first and second isolation structures 160 and 170 adjacent to each other, i.e. the gap 210 indicating a space between the first vortex pattern 164 and the second vortex pattern 174 or between the first slit pattern 162 and the second slit pattern 172, may be formed to have a smaller critical dimension t2 than at least the thickness t1 (see FIGS. 5A to 5C) of the gate conductive layer 206 which is recessed to the inside of the stacked structure 100 during a process of isolating the gate conductive layer 206. The gap 210 may have a larger critical dimension than the maximum resolution of exposure equipment which is used during a process of forming the first and second isolation structures 160 and 170, i.e. the minimum critical dimension that can be implemented by the exposure equipment.

In the present embodiment, it is exemplified that the first and second vortex patterns 164 and 174 are formed on either side of the one end of the first slit pattern 162 in the first direction D1. However, the second vortex pattern 174 may be formed only on one side or the other side of the first slit pattern 162. For reference, when the second vortex pattern 174 is located only on one side of the first slit pattern 162 in the first direction D1, the first vortex pattern 164 may be located on one side or both sides of the first slit pattern 162.

The stacked structure 100 may include a plurality of channel structures 192, a gate isolation layer 190, a support structure 150, and a third isolation structure 180. The plurality of channel structures 192 may be formed in the cell area 130, the gate isolation layer 190 may be extended from the cell area 130 to the contact area 140 in the second direction D2, the support structure 150 may be formed in the contact area 140 and connected to the gate isolation layer 190 so as to extend in the second direction D2, and the third isolation structure 180 may be spaced apart from the first and second isolation structures 160 and 170 in the first direction D1 so as to isolate each of the first and second blocks 110 and 120 from another block adjacent thereto.

The plurality of channel structures 192 may be disposed in a zigzag shape, and arranged symmetrically with respect to the gate isolation layer 190 in the first direction D1. Although not illustrated in the drawings, the channel structure 192 may include a memory layer and a channel layer. The gate isolation layer 190 may be a line-type pattern extended in the second direction D2, and have a smaller critical dimension than the critical dimension (or diameter) of the channel structure 192 and the critical dimension of the support structure 150. The support structure 150 formed in the contact area 140 may serve to support the stacked structure 100 between processes, and be a line-type pattern extended in the second direction D2. The support structure 150 may be formed at the same time as the process of forming the second isolation structure 170. The third isolation structure 180 may be a line-type pattern extended from the cell area 130 to the contact area 140 in the second direction D2, and not only isolate adjacent blocks from each other, but also serve as a common source line with the first isolation structure 160. The third isolation structure 180 may be formed at the same time as the process of forming the first isolation structure 160.

As illustrated in FIGS. 4, 5A, and 5C, the semiconductor device in accordance with the present embodiment may include a source line layer 202, the stacked structure 100, one or more gate isolation layers 190, the first isolation structure 160, and the third isolation structure 180. The source line layer 202 may be formed on a substrate 200. The stacked structure 100 may be formed on the source line layer 202 and include a plurality of interlayer dielectric layers 204 and a plurality of gate conductive layer 206, which are alternately stacked. The one or more gate isolation layers 190 may be formed on each of the first and second blocks 110 and 120 of the stacked structure 100, and isolate one or more gate conductive layers 206 located at the uppermost part of the stacked structure 100. The first isolation structure 160 may be formed through the stacked structure 100 such that the bottom surface thereof abuts on the source line, and isolate the first and second blocks 110 and 120 from each other. The third isolation structure 180 may be formed through the stacked structure 100 and isolate each of the first and second blocks 110 and 130 from another block adjacent thereto. Although not illustrated in the drawings, a dielectric layer may be formed between the substrate 200 and the source line layer 202 so as to electrically isolate the substrate 200 and the source line layer 202 from each other.

The source line layer 202 may include a semiconductor layer doped with a predetermined impurity. For example, the source line layer may be a semiconductor layer doped with an N-type impurity. The semiconductor layer may be a silicon layer. For example, the source line layer 202 may be formed by implanting an impurity into the substrate 200 as illustrated in FIG. 1A, or formed by depositing a doped silicon layer on the substrate 200. For another example, the source line layer 202 may be formed through a process of forming a dielectric layer on the structure on which the peripheral circuit is formed as illustrated in FIG. 1B and then depositing a doped silicon layer on the dielectric layer.

The stacked structure 100 may have a structure in which the plurality of gate conductive layers 206 and the plurality of interlayer dielectric layers 204 are alternately stacked, and the interlayer dielectric layer 204 may be disposed at the lowermost and uppermost parts of the stacked structure 100. The gate conductive layer 206 may include a metallic layer, and the interlayer dielectric layer 204 may include an oxide layer. One or more gate conductive layers 206 located at the lowermost part of the plurality of gate conductive layers 206 may serve as the source select line SSL, one or more gate conductive layers 206 located at the uppermost part of the plurality of gate conductive layers 206 may serve as the drain select line DSL, and the other gate conductive layers 206 located between the source select line SSL and the drain select line DSL may serve as the word lines WL to WLn. The gate isolation layer 190 may serve to isolate the drain select line DSL, and include an oxide layer.

The first isolation structure 160 and the third isolation structure 180 may serve to isolate a plurality of blocks in the stacked structure 100, and be electrically coupled to the source line layer 202 so as to serve as the common source line. The first isolation structure 160 and the third isolation structure 180 may be simultaneously formed through the same process. The first isolation structure 160 may include a first opening 166, a spacer 168, a first conductive layer, and a second conductive layer. The first opening 166 may be formed through the stacked structure 100, the spacer 168 may be formed on the sidewall of the first opening 166, the first conductive layer may gap-fill a part of the opening 166 and abut on the source line layer 202, and the second conductive layer may be formed on the first conductive layer so as to gap-fill the other part of the first opening 166. The third isolation structure 180 may include a third opening 182, a spacer 184, the first conductive layer, and the second conductive layer. The third opening 182 may be formed through the stacked structure 100, the spacer 184 may be formed on the sidewall of the third opening 182, the first conductive layer may gap-fill a part of the third opening 182 and abut on the source line layer 202, and the second conductive layer may be formed on the first conductive layer so as to gap-fill the other part of the third opening 182. Because the first conductive layer abuts on the source line layer 202, the first conductive layer may include a doped semiconductor layer to improve a contact interface characteristic between the source line layer 202 and the first conductive layer. The second conductive layer may include a metallic layer to reduce the entire resistance of the common source line.

In the stacked structure 100, the sidewalls of the plurality of gate conductive layers 206, facing the sidewalls of the first and third openings 166 and 182, may be recessed to the inside of the stacked structure 100 by a predetermined thickness. That is, the stacked structure 100 may include grooves 208 formed between the sidewalls of the first and third openings 166 and 182 and the sidewalls of the plurality of gate conductive layers 206. Although described below, the grooves 208 may be formed through a process of isolating the gate conductive layer 206.

The spacers 168 and 184 formed on the sidewalls of the first and third openings 166 and 182 may serve to electrically insulate the first and second conductive layers, gap-fill the first and third openings 166 and 182, form the gate conductive layer 206 of the stacked structure 100, and include a dielectric layer. For example, each of the spacers 168 and 184 may be any one single layer selected from the group consisting of an oxide layer, a nitride layer, and an oxynitride layer, or be a multilayer of two or more layers selected from the group. Parts of the spacers 168 and 184 may fill the plurality of grooves 208 formed between the sidewalls of the first and third openings 166 and 182 and the sidewalls of the plurality of gate conductive layers 206, respectively.

As illustrated in FIGS. 4 and 5B, the semiconductor device in accordance with the present embodiment may include the second isolation structure 170 and the support structure 150. The second isolation structure 170 may be formed through the stacked structure 100 so as to isolate the first and second blocks 110 and 120 of the stacked structure 100 from each other with the first isolation structure 160, and disposed adjacent to the first isolation structure 160 with the gap 210 provided therebetween. The support structure 150 may be located on either side of the second isolation structure 170 and formed through the stacked structure 100.

The second isolation structure 170 and the support structure 150 may be formed before the first isolation structure 160 and the third isolation structure 180, and serve to support the stacked structure 100 between processes. The second isolation structure 170 and the support structure 150 may be simultaneously formed through the same process. Because the first vortex pattern 164 of the first isolation structure 160 and the second vortex pattern 174 of the second isolation structure 170 are adjacent to each other with the gap 210 provided therebetween and the critical dimension t2 of the gap 210 is smaller than the critical dimension t1 of the groove 208 formed adjacent to the gate conductive layer 206, the gate conductive layer 206 is not left between the first vortex pattern 164 and the second vortex pattern 174.

The second isolation structure 170 may include a second opening 172 to expose the source line layer 202 through the stacked structure 100 and a gap-fill dielectric layer to gap-fill the second opening 172, and the support structure 150 may include a fourth opening 152 to expose the source line layer 202 through the stacked structure 100 and a gap-fill dielectric layer to gap-fill the fourth opening 152. The gap-fill dielectric layer may include an oxide layer.

In the present embodiment, it has been exemplified that the line-type support structure 150 is formed in the contact area 140. However, the support structure 150 may have various planar shapes such as a hole shape and T-shape in addition to the line type, and have a structure in which the shapes are mixed.

In the semiconductor device in accordance with the present embodiment, the stacked structure 100 may be isolated into the first and second blocks 110 and 120 by the first and second isolation structures 160 and 170 which do not overlap each other when viewed from the top, which makes it possible to prevent damage to the structure located under the stacked structure 100, for example, the source line layer 202, during the isolation structure forming process.

Furthermore, one end of the first isolation structure 160 and the other end of the second isolation structure 170, facing each other, have a vortex shape when viewed from top, and are formed in such a shape that two patterns are engaged and rotated. Therefore, although misalign occurs between processes, it is possible to effectively prevent an abnormal conductive path from being formed between the gate conductive layer 206 located in the first block 110 and the gate conductive layer 206 located in the second block 120.

In order to prevent an abnormal conductive path from being formed between the gate conductive layer 206 located in the first block 110 and the gate conductive layer 206 located in the second block 120, one end of the first isolation structure 160 and the other end of the second isolation structure 170 in the isolation structure for isolating the first and second blocks 110 and 120 may overlap each other by a predetermined area on a plane. With the overlap, etch damage may be concentrated on the overlap area. This may cause damage to the structure formed under the stacked structure 100, for example, the source line layer 202 and the substrate 200. When misalign occurs, the first and second isolation structures 160 and 170 may be discontinuously formed to cause a defect. For example, an abnormal conductive path may be formed between the gate conductive layer 206 located in the first block 110 and the gate conductive layer 206 located in the second block 120.

Hereafter, a method for fabricating a semiconductor device in accordance with an embodiment will be described in detail with reference to the drawings.

FIGS. 6A to 6H are cross-sectional views illustrating a method for fabricating a semiconductor device in accordance with an embodiment, taken along the line II-II' of FIG. 4.

Figure 6A:
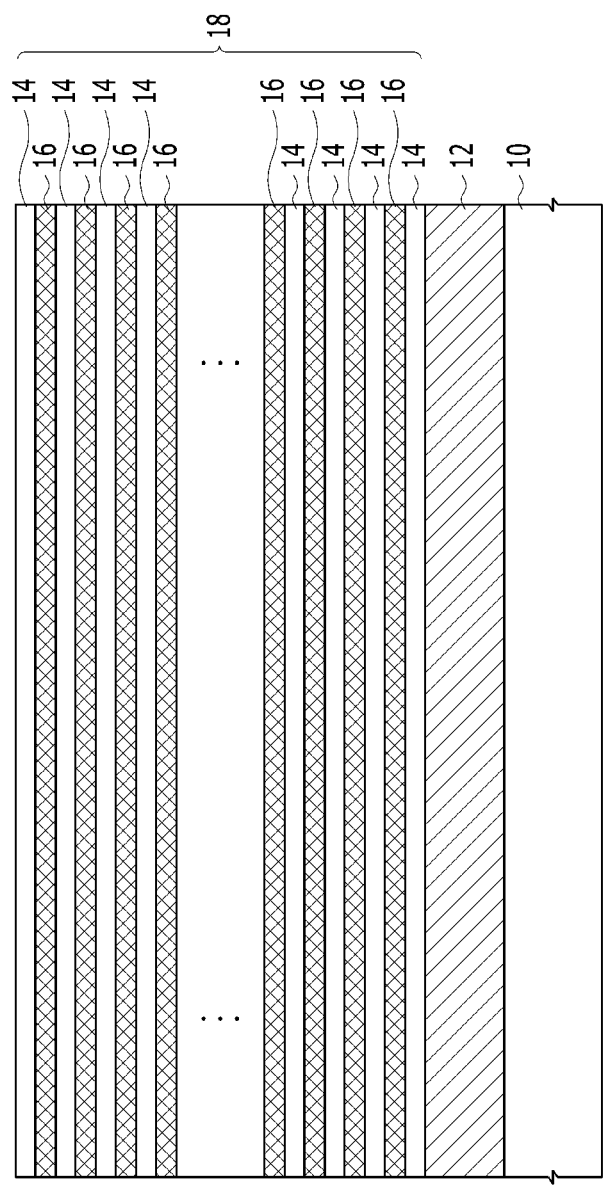
FIGS. 6A to 6H are cross-sectional views illustrating a method for fabricating a semiconductor device in accordance with an embodiment, taken along the line II-II' of FIG. 4.

As illustrated in FIG. 6A, a source line layer 12 is formed on a substrate 10. The source line layer 12 may be formed of a doped semiconductor layer. For example, the source line layer 12 may be formed of a silicon layer doped with an n-type impurity.

Although not illustrated, when a predetermined structure such as a peripheral circuit is formed under the source line layer 12 as illustrated in FIG. 1B, a dielectric layer may be formed on the substrate 10 before the source line layer 12 is formed. The dielectric layer may serve to electrically isolate the source line layer 12 and the predetermined structure formed on the substrate 10.

Then, a stacked body 18 in which a plurality of first material layers 14 and second material layers 16 are sequentially and alternately stacked is formed on the source line layer 12. At this time, the stacked body 18 may be formed so that the first material layer 14 is located at the lowermost layer and the uppermost layer thereof. The second material layer 16 may be a sacrificial layer for forming a conductive layer such as a word line, select line or pad, and the first material layer 14 may serve to insulate the stacked conductive layers from each other. The first and second material layers 14 and 16 may be formed of dielectric materials having a high difference in etch selectivity. For example, the first material layers 14 may be formed of an oxide layer, and the second material layers 16 may be formed of a nitride layer having a high etch selectivity with respect to the oxide layer.

Figure 6B:
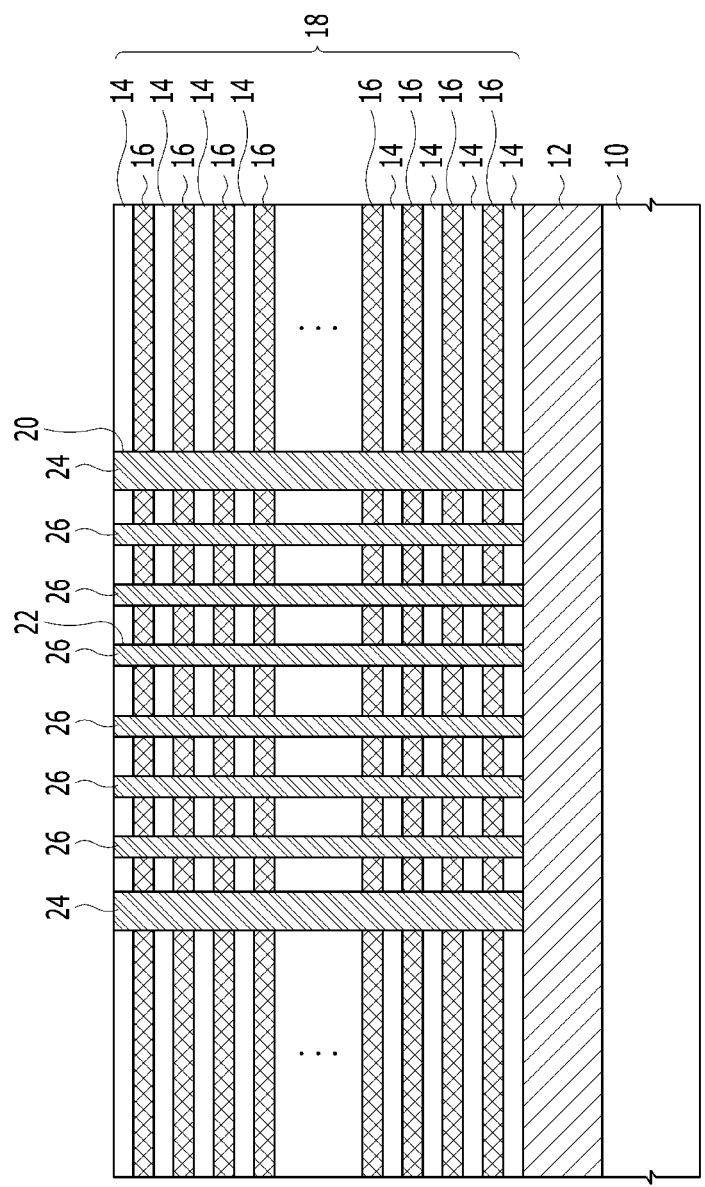

As illustrated in FIG. 6B, a first mask pattern (not illustrated) is formed on the stacked body 18, and first and second openings 20 and 22 are formed by etching the stacked body 18 using the first mask pattern as an etch barrier until the source line layer 12 is exposed. The first opening 20 is used to form the support structure, and the second opening 22 is used to form the second isolation structure (see FIG. 4).

Then, the first mask pattern is removed, and a first gap-fill dielectric layer 24 for gap-filling the first opening 20 and a second gap-fill dielectric layer 26 for gap-filling the second opening 22 are formed at the same time. The first gap-fill dielectric layer 24 may serve as the support structure, and the second gap-fill dielectric layer 26 may serve as the second isolation structure (see FIG. 4). The first and second gap-fill dielectric layers 24 and 26 may be formed of a material having an etch selectivity with respect to the second material layer 16 of the stacked body 18. For example, when the second material layer 16 is formed of nitride, the first and second gap-fill dielectric layers 24 and 26 may be formed of oxide. The first and second gap-fill dielectric layers 24 and 26 may be formed through a series of processes of depositing a dielectric material to fill the first and second openings 20 and 22 and then performing a planarization process until the top surface of the stacked body 18 is exposed.

Figure 6C:
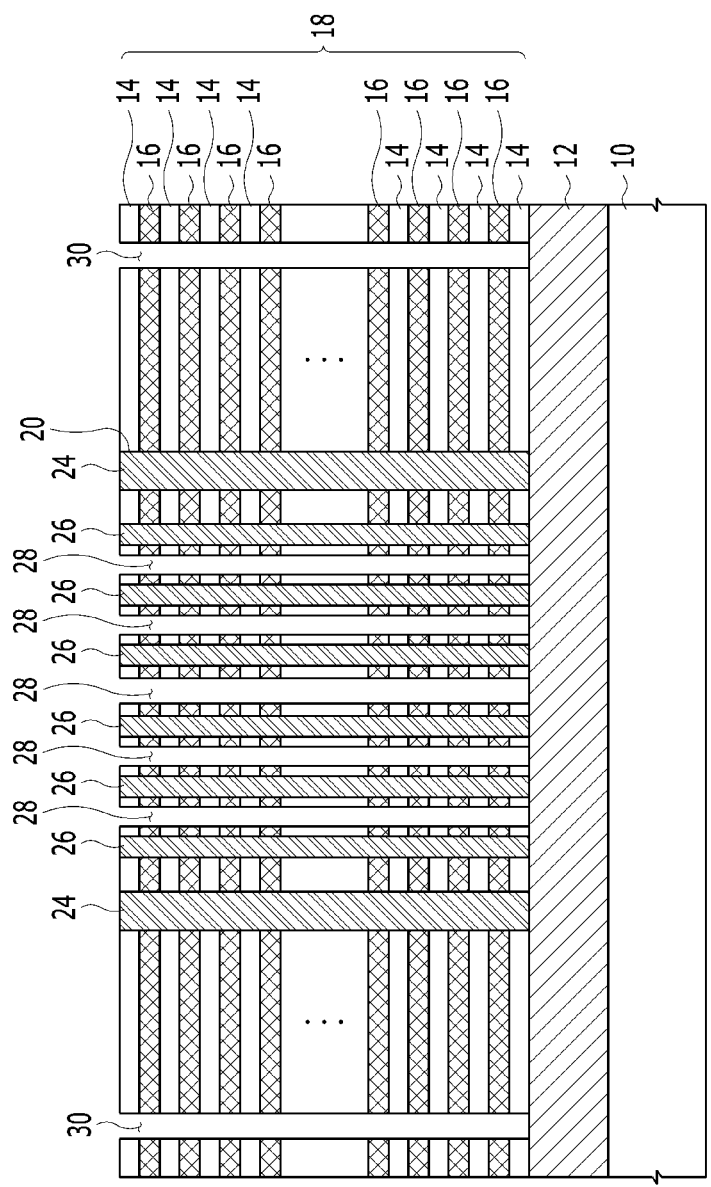

As illustrated in FIG. 6C, a second mask pattern (not illustrated) is formed on the stacked body 18, and third and fourth openings 28 and 30 having different critical dimensions are formed by etching the stacked body 18 using the second mask pattern as an etch barrier until the source line layer 12 is exposed. The third opening 28 is used to form the first isolation structure, and the fourth opening 30 is used to form the third isolation structure (see FIG. 4).

Because the third opening 28 does not overlap the previously formed second gap-fill dielectric layer (second isolation structure) 26 when viewed from the top, it is possible to prevent unexpected etch damage to the lower structure of the stacked body 18, i.e. the source line layer 12 and the substrate 10, during the process of forming the third opening 28. Furthermore, because one end of the previously formed second gap-fill dielectric layer 26 has a vortex shape, the second gap-fill dielectric layer 26 may serve as an align key during the process of forming the second mask pattern. Through this structure, it is possible to more effectively prevent etch damage caused by overlap while improving the process accuracy.

Then, the second mask pattern is removed.

Figure 6D:
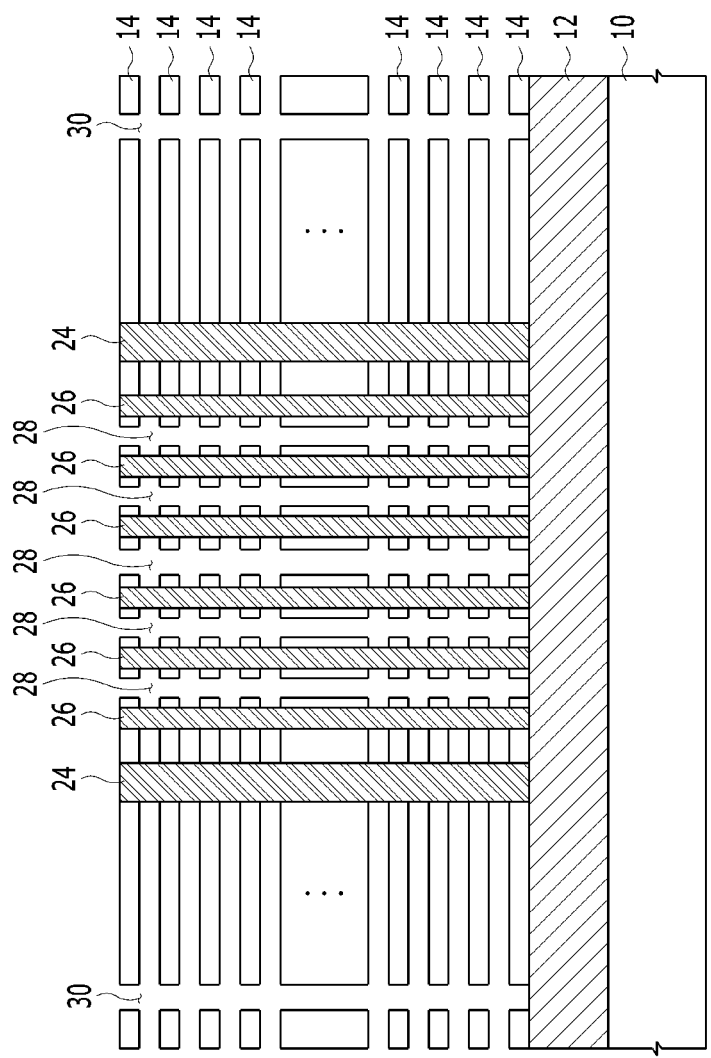

As illustrated in FIG. 6D, the second material layer 16 is removed from the stacked body 18 through the third and fourth openings 28 and 30. Because the first material layer 14, the first gap-fill dielectric layer 24, and the second gap-fill dielectric layer 26 of the stacked body 18 have an etch selectivity with respect to the second material layer 16 of the stacked body 18, only the second material layer 16 may be selectively removed. During the process of removing the second material layer 16, the first and second gap-fill dielectric layers 24 and 26 formed through the stacked body 18 may support the stacked body 18 and thus prevent deformation in shape of the stacked body 18.

Figure 6E:
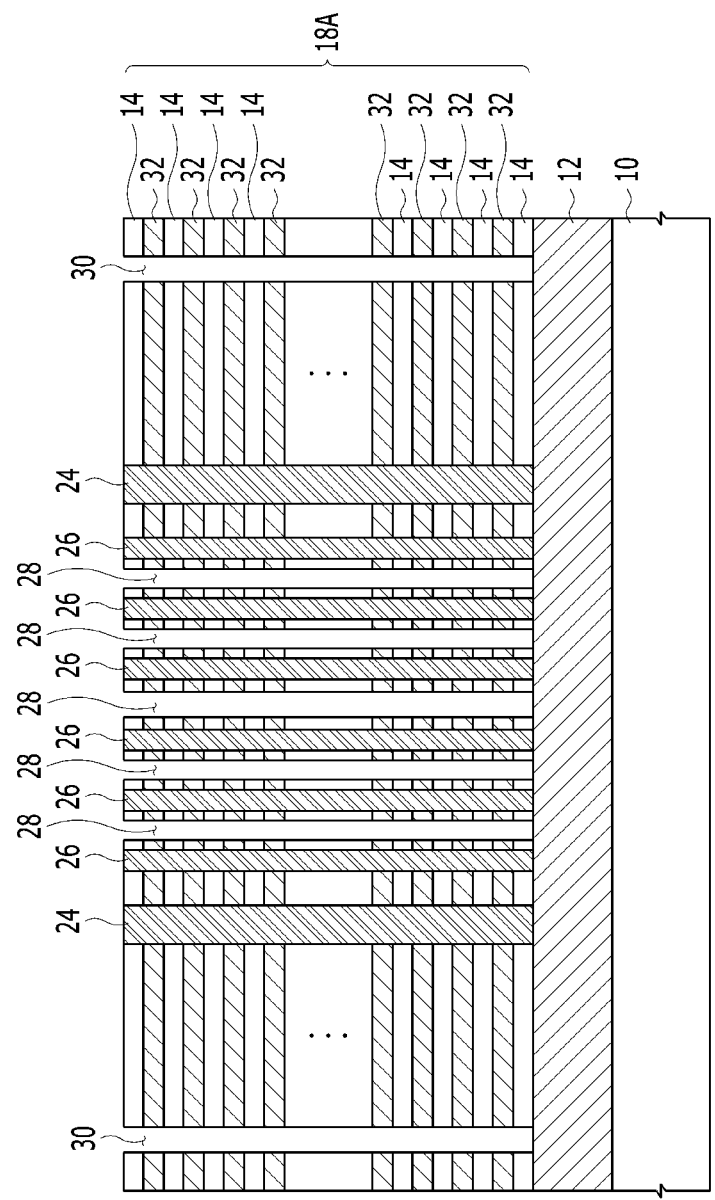

As illustrated in FIG. 6E, a plurality of gate conductive layers 32 are formed by gap filling, with a conductive material, the space of the stacked structure, from which the second material layer 16 is removed. The conductive material for forming the gate conductive layer 32 may be a metallic material.

Thus, a stacked structure 18A may be formed, in which the plurality of gate conductive layers 32 and the plurality of first material layers 14 serving as interlayer dielectric layers are alternately stacked.

Although not illustrated in the drawings, a conductive material may also be deposited on the sidewalls of the third and fourth openings 28 and 30 during a deposition process for forming the gate conductive layer 32. Thus, the interlayer gate conductive layers 32 may be connected to each other.

Figure 6F:
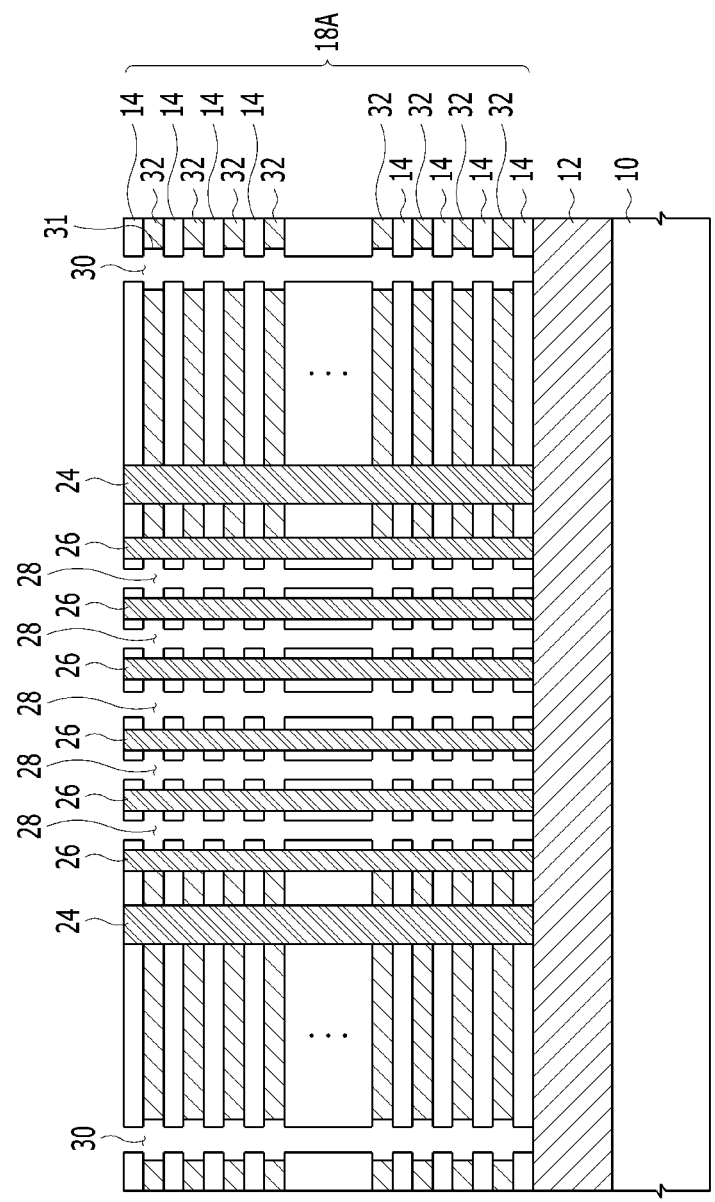

As illustrated in FIG. 6F, a gate conductive layer isolation process is performed by removing the conductive material left on the sidewalls of the third and fourth openings 28 and 30 in order to prevent the interlayer gate conductive layers 32 from being connected to each other. As the gate conductive layer isolation process, a blanket etch process, for example, an etchback process may be performed.

During a process of isolating the gate conductive layer 32, the gate conductive layer 32 may be recessed to the inside of the stacked structure 18A by a predetermined thickness. Thus, grooves 31 may be formed between the sidewalls of the third and fourth openings 28 and 30 and the sidewall of the gate conductive layer 32. At this time, the groove 31 may have a critical dimension at which the gate conductive layer 32 left on the sidewall of the previously formed second gap-fill dielectric layer (second isolation structure, see FIG. 4) 26 can all removed. That is, the groove 31 may have a larger critical dimension than the gap (see FIG. 4) between the second and third openings 22 and 28.

Figure 6G:
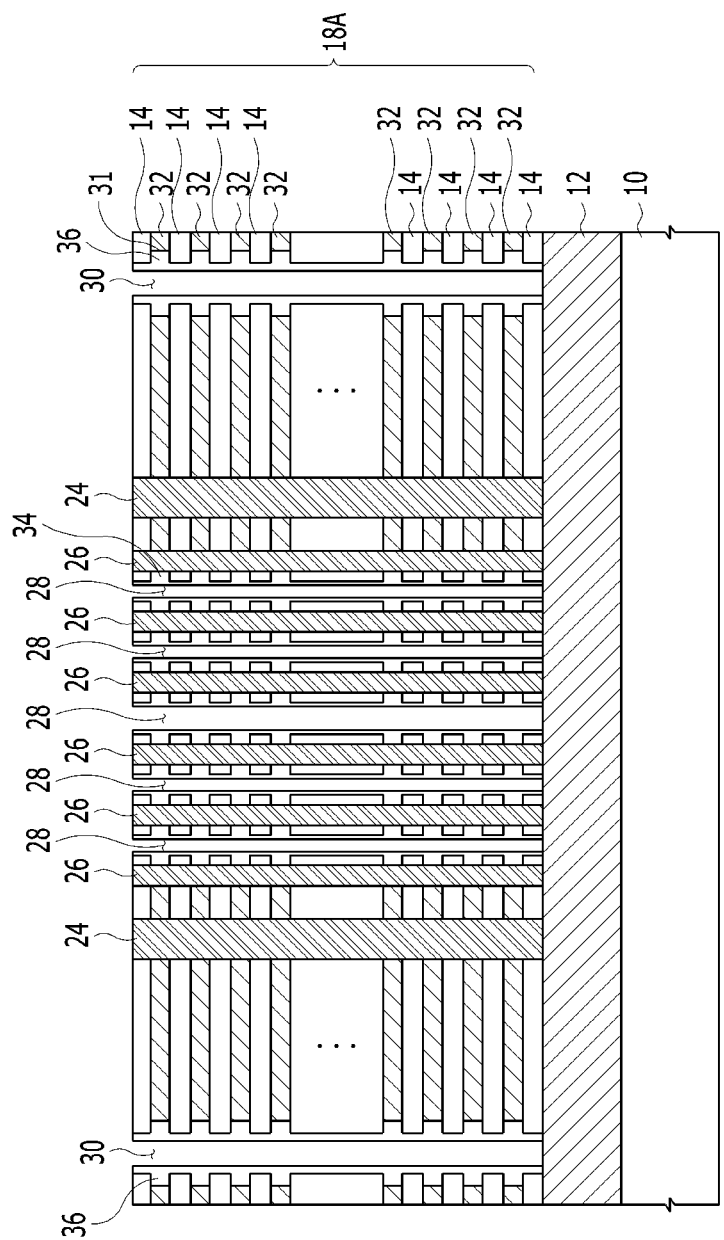

As illustrated in FIG. 6G, first and second spacers 34 and 36 are formed on the sidewalls of the third and fourth openings 28 and 30, respectively. At this time, the first and second spacers 34 and 36 may be formed so that parts thereof gap-fill the grooves 31 formed between the sidewalls of the third and fourth openings 28 and 30 and the sidewall of the gate conductive layer 32. The first and second spacers 34 and 36 may be formed of any one layer selected from the group consisting of an oxide layer, a nitride layer and an oxynitride layer or a multilayer of two or more layers selected from the group. The first and second spacers 34 and 36 may be formed at the same time or separately formed in consideration of the critical dimensions thereof.

Figure 6H:
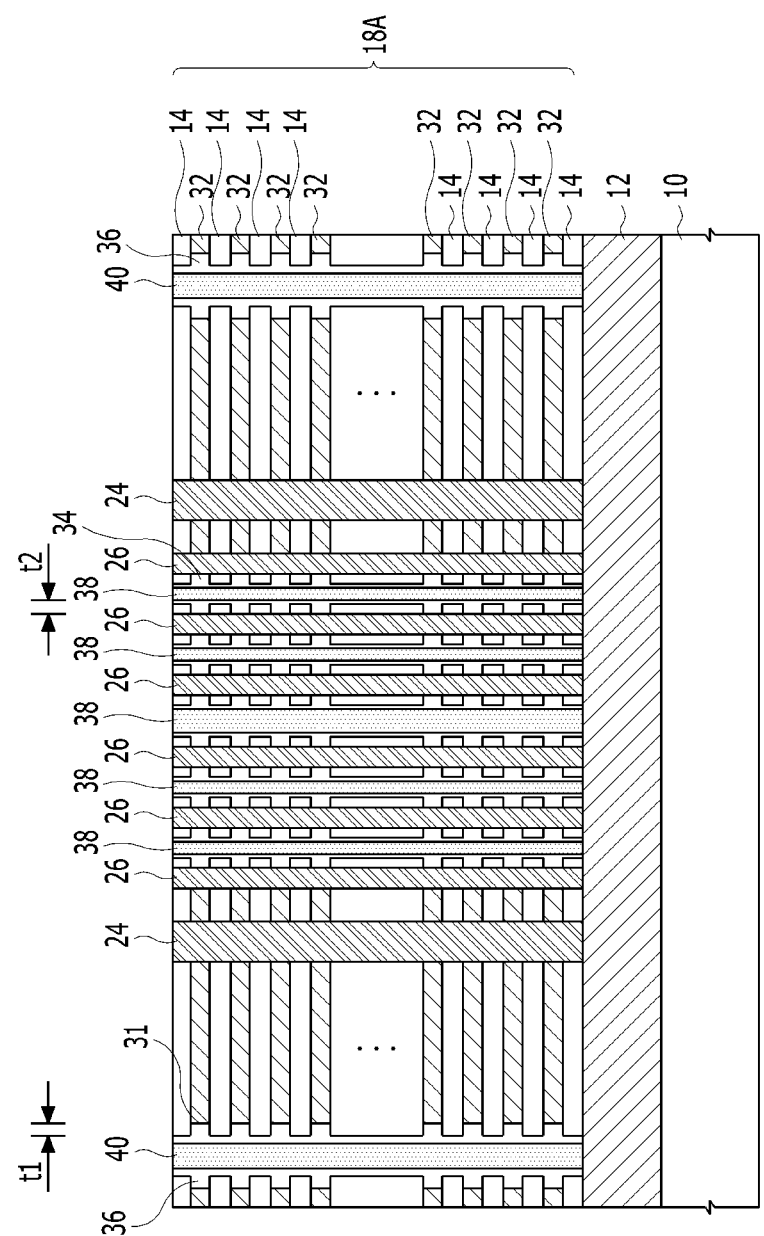

As illustrated in FIG. 6H, a first gap-fill conductive layer 38 for gap-filling the third opening 28 and a second gap-fill conductive layer 40 for gap-filling the fourth opening 30 are formed at the same time. The first gap-fill conductive layer 38 may serve as the first isolation structure, and the second gap-fill conductive layer 40 may serve as the third isolation structure (see FIG. 4). The first and second gap-fill conductive layers 38 and 40 may be formed of a metallic layer or a semiconductor layer doped with an impurity, or a stacked layer of a doped semiconductor layer and a metallic layer. The first and second gap-fill conductive layers 38 and 40 may be formed through a series of processes of depositing a conductive material to fill the third and fourth openings 28 and 30 and then performing a planarization process until the top surface of the stacked structure 18A is exposed.

The semiconductor device in accordance with the present embodiment can be fabricated through the above-described process, and processes which are not described may be performed through publicly known technology.

Figure 7:
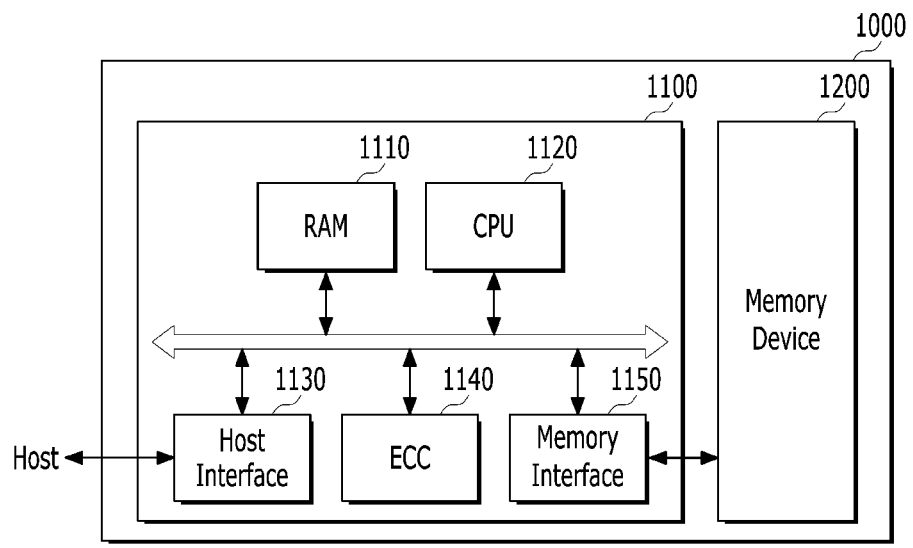
FIG. 7 is a block diagram of the configuration of a memory system according to an embodiment of the present disclosure.

FIG. 7 is a block diagram of a configuration of a memory system 1000 according to an embodiment of the present disclosure.

As illustrated in FIG. 7, the memory system 1000 may include a memory device 1200 and a controller 1100.

The memory device 1200 may be used to store various data types such as text, graphic, and software code. The memory device 1200 may be a non-volatile memory. The memory device 1200 may be the semiconductor device described above with reference to FIGS. 4 to 5A. In addition, the memory device 1200 may include a stacked structure comprising a plurality of dielectric layers and a plurality of conductive layers, wherein the dielectric layers are alternately stacked with the conductive layers; a groove formed for each conductive layer by recessing the conductive layer to the inside of the stacked structure; and an isolation structure formed through the stacked structure so as to isolate the stacked structure into a first block and a second block. The isolation structure comprises a first isolation structure and a second isolation structure adjacent to the first isolation structure with a gap provided between the first and second isolation structures, and one end of the first isolation structure and the other end of the second isolation structure, which face each other, have a vortex shape when viewed from above. Because the memory device 1200 is formed and manufactured in the above-described manner, a detailed description thereof will be omitted.

The controller 1100 may be couple to a host and the memory device 1200, and may access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

As described above, because the memory system 1000 according to an embodiment of the present disclosure can be manufactured and includes the memory device 1200 having a stable structure and improved characteristics, the characteristics of the memory system 1000 may also be improved.

Figure 8:
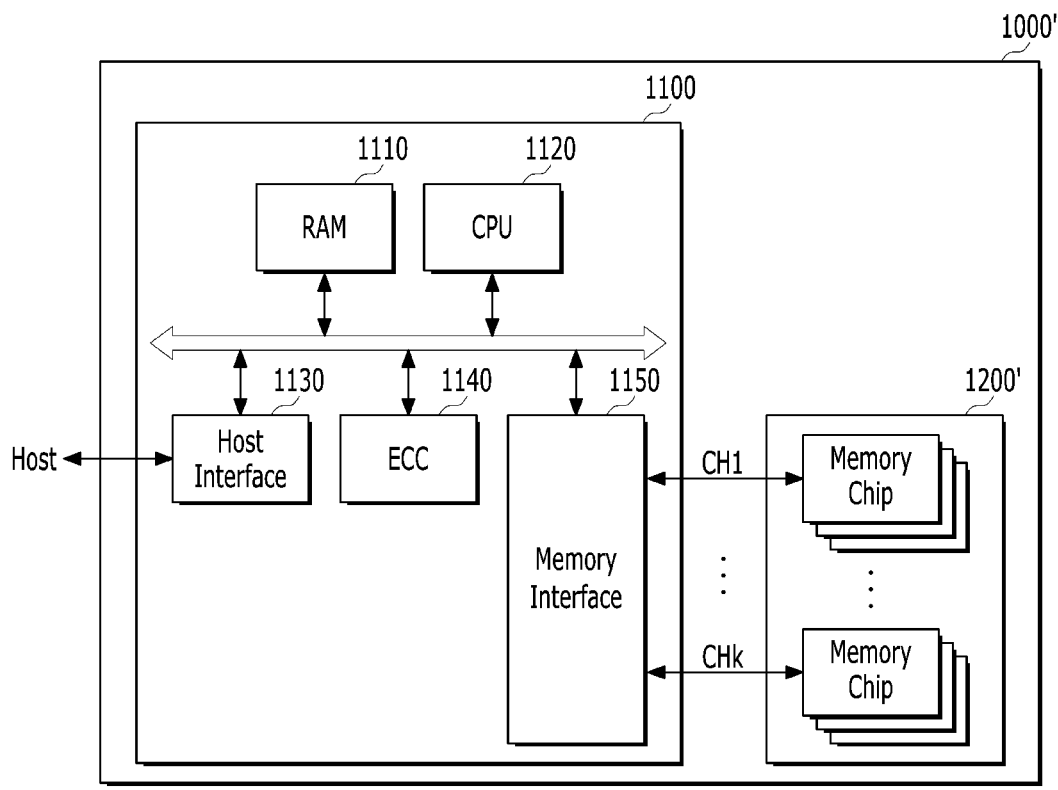
FIG. 8 is a block diagram of the configuration of a memory system according to an embodiment of the present disclosure.

FIG. 8 is a block diagram of the configuration of a memory system 1000' according to an embodiment of the present disclosure. Hereinafter, a description of common contents with the earlier described embodiment is omitted.

As illustrated in FIG. 8, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory device. The memory device 1200' may be the semiconductor device described above with reference to FIGS. 4 to 5A. In addition, the memory device 1200' may include a stacked structure comprising a plurality of dielectric layers and a plurality of conductive layers, wherein the dielectric layers are alternately stacked with the conductive layers; a groove formed for each conductive layer by recessing the conductive layer to the inside of the stacked structure; and an isolation structure formed through the stacked structure so as to isolate the stacked structure into a first block and a second block. The isolation structure comprises a first isolation structure and a second isolation structure adjacent to the first isolation structure with a gap provided between the first and second isolation structures, and one end of the first isolation structure and the other end of the second isolation structure, which face each other, have a vortex shape when viewed from above. Because the memory device 1200' is formed and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, because the memory system 1000' according to an embodiment of the present disclosure can be manufactured and includes the memory device 1200' having a stable structure and improved characteristics, the characteristics of the memory system 1000' may also be improved. In addition, the data storage capacity of the memory system 1000' may be further increased by forming the memory device 1200' using a multi-chip package.

Figure 9:
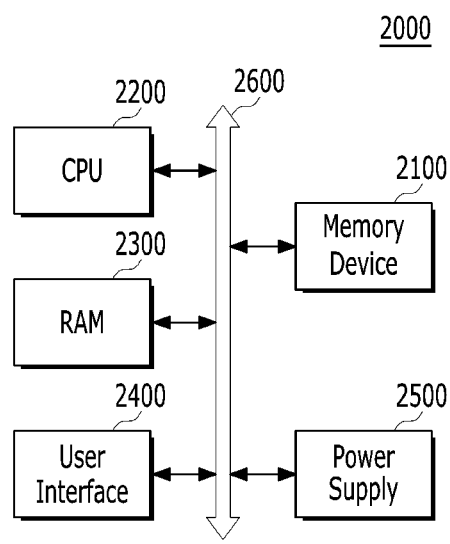
FIG. 9 is a block diagram of the configuration of a computing system according to an embodiment of the present disclosure.

FIG. 9 is a block diagram of the configuration of a computing system 2000 according to an embodiment of the present disclosure. Hereinafter, a description of common contents with the earlier described embodiments is omitted.

As illustrated in FIG. 9, the computing system 2000 may include a memory device 2100, a CPU 2200, a random-access memory (RAM) 2300, a user interface 2400, a power supply 2500, and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400, and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 4 to 5A. The memory device 2100 may include a stacked structure comprising a plurality of dielectric layers and a plurality of conductive layers, wherein the dielectric layers are alternately stacked with the conductive layers; a groove formed for each conductive layer by recessing the conductive layer to the inside of the stacked structure; and an isolation structure formed through the stacked structure so as to isolate the stacked structure into a first block and a second block. The isolation structure comprises a first isolation structure and a second isolation structure adjacent to the first isolation structure with a gap provided between the first and second isolation structures, and one end of the first isolation structure and the other end of the second isolation structure, which face each other, have a vortex shape when viewed from above. Because the memory device 2100 is formed and manufactured in the above-described manner, a detailed description thereof will be omitted.

In addition, as described above with reference to FIG. 8, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, because the computing system 2000 according to an embodiment of the present disclosure can be manufactured and includes a memory device 2100 having a stable structure and improved characteristics, the characteristics of the computing system 2000 may also be improved.

Figure 10:
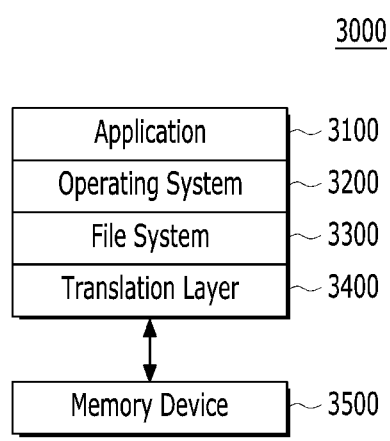
FIG. 10 is a block diagram of a computing system according to an embodiment of the present disclosure.

FIG. 10 is a block diagram of a computing system 3000 according to an embodiment of the present disclosure.

As illustrated in FIG. 10, the computing system 3000 may include a software layer that has an operating system 3100 an application 3200, a file system 3300, and a translation layer 3400. In addition, the computing system 3000 may include a hardware layer such as a memory system 3500.

The operating system 3100 manages software and hardware resources of the computing system 3000. The operating system 3100 may control program execution of a central processing unit. The application 3200 may include various application programs executed by the computing system 3000. The application 3200 may be a utility executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS), or a journaling file system (JFS).

FIG. 10 illustrates the operating system 3100, the application 3200, and the file system 3300 in separate blocks. However, the application 3200 and the file system 3300 may be included in the operating system 3100.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a non-volatile memory device. The memory device 3500 may be the semiconductor memory device described above with reference to FIGS. 4 to 5A. In addition, the memory device 3500 may include a stacked structure comprising a plurality of dielectric layers and a plurality of conductive layers, wherein the dielectric layers are alternately stacked with the conductive layers; a groove formed for each conductive layer by recessing the conductive layer to the inside of the stacked structure; and an isolation structure formed through the stacked structure so as to isolate the stacked structure into a first block and a second block. The isolation structure comprises a first isolation structure and a second isolation structure adjacent to the first isolation structure with a gap provided between the first and second isolation structures, and one end of the first isolation structure and the other end of the second isolation structure, which face each other, have a vortex shape when viewed from above. Because the memory device 3500 is formed and manufactured in the above-described manner, a detailed description thereof will be omitted.

The computing system 3000 having the above-described configuration may be divided into an operating system layer that is operated in an upper layer region and a controller layer that is operated in a lower level region. The operating system 3100, the application 3200, and the file system 3300 may be included in the operating system layer and driven by an operation memory. In addition, the translation layer 3400 may be included in the operating system layer or the controller layer.

As described above, because the computing system 3000 according to an embodiment of the present teachings can be manufactured to include a memory device 3500 having a stable structure and improved characteristics, the characteristics of the computing system 3000 may also be improved.

As described above, the method for fabricating a semiconductor device in accordance with the present embodiment may isolate the stacked structure into the first and second blocks using the first gap-fill conductive layer (first isolation structure) 38 and the second gap-fill dielectric layer (second isolation structure) 26, which do not overlap each other, thereby preventing damage to the structure located under the stacked structure during the isolation structure forming process.

Furthermore, one end of the first isolation structure and the other end of the second isolation structure, facing each other, have a vortex shape when viewed from the top, and are formed in such a shape that the two patterns are engaged and rotated. Thus, although misalign occurs between processes, it is possible to prevent an abnormal conductive path from being formed between the gate conductive layer located in the first block and the gate conductive layer 32 located in the second block.

Furthermore, as the second vortex pattern of the second isolation structure serves as an align key during the first isolation structure forming process, it is possible to improve the process accuracy during the first isolation structure forming process.

While various embodiments have been described above, it will be understood by those skilled in the art that the described embodiments serve examples only. Accordingly, the operating method of a data storage device described herein should not be limited based on the described embodiments.

What is claimed is:

1. A method for fabricating a semiconductor device, comprising the steps of:
    forming a stacked body over a substrate, the stacked body including a plurality of dielectric layers and a plurality of sacrificial layers alternately stacked with the dielectric layers;
    forming a second isolation structure through the stacked body;
    forming an opening through the stacked body, the opening being adjacent to the isolation structure with a gap provided therebetween;
    removing the sacrificial layers of the stacked body through the opening;
    forming a conductive layer to gap-fill the spaces from which the sacrificial layers are removed;
    forming a groove by recessing the conductive layer to the inside of the stacked body; and
    forming a first isolation structure to gap-fill the opening,
    wherein one end of the first isolation structure and the other end of the second isolation structure, facing each other, have a vortex shape when viewed from above.

2. The method of claim 1, further comprising:
    forming a spacer on a sidewall of the opening for gap-filling a part of the groove, before forming the first isolation structure to gap-fill the opening.

3. The method of claim 1, wherein the gap has a smaller critical dimension than the groove.

4. The method of claim 1, wherein the one end of the first isolation structure and the other end of the second isolation structure, facing each other, have a vortex shape when viewed from above, and are formed in such a shape that two patterns are engaged and rotated.

5. The method of claim 1, wherein the first isolation structure comprises a first slit pattern extended in one direction and a first vortex pattern extended from one end of the first slit pattern and having a vortex shape when viewed from above,
    wherein the second isolation structure comprises a second slit pattern extended in one direction and disposed adjacent to the first slit pattern with the gap provided therebetween, and a second vortex pattern extended from the other end of the second slit pattern and having a vortex shape when viewed from above.

6. The method of claim 5, wherein the first and second vortex patterns are located on one side or the other side of the first slit pattern, or located on either side of the first slit pattern so as to be symmetrical with respect to the first slit pattern.

7. The method of claim 5, wherein the second vortex pattern is located outside of the first vortex pattern and has a shape to surround the first vortex pattern, and the first vortex pattern has a smaller length than the second vortex pattern.

8. A method for fabricating a semiconductor device, comprising the steps of:
    forming a stacked body including a cell area, a contact area and a boundary area located between the cell area and the contact area;
    forming a first through hole for separating the contact area of the stacked body and a plurality of second through holes for separating the boundary area;
    forming contact isolation structures by filling an insulation material in the first and second through holes; and
    forming a third through hole for separating the cell area and a plurality of fourth through holes in the boundary area, each of the fourth through holes being formed to be spaced from each of the second through holes by a set gap; and
    forming separating structures by filling at least one conductive material in the third through hole and the fourth through holes, respectively.

9. The method of claim 8, wherein the plurality of second through holes is formed to be extended from the first through hole, and the plurality of second through holes is formed to have a spiral-shaped planar shape.

10. The method of claim 9, wherein the plurality of fourth through holes is formed to be extended from the third through hole, and the plurality of fourth through holes is formed to have a spiral-shaped planar shape, with facing the plurality of second through holes.

11. The method of claim 10, wherein the forming the stacked body includes:
    alternately stacking a plurality of first layers and a plurality of second layers
    selectively etching the plurality of second layers of the stacked body, thereby forming a plurality of spaces between the first layers; and
    forming a plurality of gate conductive layer by filling a conductive material in the spaces.

* * * * *